(12) United States Patent
Kuo et al.

(10) Patent No.: US 10,263,096 B1
(45) Date of Patent: Apr. 16, 2019

(54) FINFET DEVICE AND METHOD OF FORMING THE SAME

(71) Applicant: United Microelectronics Corp., Hsinchu (TW)

(72) Inventors: Chun-Liang Kuo, Kaohsiung (TW); Tsang-Hsuan Wang, Kaohsiung (TW); Yu-Ming Hsu, Changhua County (TW); Tsung-Mu Yang, Tainan (TW); Ching-I Li, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/878,836

(22) Filed: Jan. 24, 2018

(51) Int. Cl.
| | |
|---|---|
| *H01L 29/78* | (2006.01) |
| *H01L 29/66* | (2006.01) |
| *H01L 21/02* | (2006.01) |
| *H01L 27/11* | (2006.01) |
| *H01L 27/088* | (2006.01) |
| *H01L 29/08* | (2006.01) |
| *H01L 29/16* | (2006.01) |
| *H01L 29/24* | (2006.01) |
| *H01L 21/8234* | (2006.01) |
| *H01L 21/311* | (2006.01) |

(52) U.S. Cl.
CPC ...... *H01L 29/6656* (2013.01); *H01L 21/0214* (2013.01); *H01L 21/0217* (2013.01); *H01L 21/02167* (2013.01); *H01L 21/02326* (2013.01); *H01L 21/02521* (2013.01); *H01L 21/02529* (2013.01); *H01L 21/31116* (2013.01); *H01L 21/823418* (2013.01); *H01L 21/823431* (2013.01); *H01L 27/0886* (2013.01); *H01L 27/1104* (2013.01); *H01L 27/1116* (2013.01); *H01L 29/0847* (2013.01); *H01L 29/1608* (2013.01); *H01L 29/24* (2013.01); *H01L 29/66545* (2013.01); *H01L 29/7848* (2013.01)

(58) Field of Classification Search
CPC .......................... H01L 27/0886; H01L 29/785
See application file for complete search history.

(56) References Cited

U.S. PATENT DOCUMENTS

| | | | |
|---|---|---|---|
| 7,838,372 B2 | 11/2010 | Han et al. | |
| 9,006,805 B2 | 4/2015 | Liao et al. | |
| 9,691,901 B2 | 6/2017 | Shen et al. | |
| 2018/0182756 A1* | 6/2018 | Lee | ..................... H01L 27/0886 |

* cited by examiner

*Primary Examiner* — Thomas L Dickey
(74) *Attorney, Agent, or Firm* — J.C. Patents

(57) ABSTRACT

A FinFET device includes a substrate, first and second fins, first and second gates and first and second epitaxial layers. The substrate has a first region and a second region. The first and second fins are on the substrate respectively in the first and second regions. In an embodiment, the number of the first fins is different from the number of the second fins. The first and second gates are on the substrate and respectively across the first and second fins. The first epitaxial layers are disposed in first recesses of the first fins adjacent to the first gate. The second epitaxial layers are disposed in second recesses of the second fins adjacent to the second gate. In an embodiment, the maximum width of the first epitaxial layers is L1, the maximum width of the second epitaxial layers is L2, and (L2−L1)/L1 is equal to or less than about 1%.

9 Claims, 8 Drawing Sheets

FINFET DEVICE AND METHOD OF FORMING THE SAME

BACKGROUND OF THE INVENTION

Field of Invention

The present invention is related to a semiconductor device and a method of forming the same, and more generally to a FinFET device and a method of forming the same.

Description of Related Art

In the field of integrated circuit devices, the device dimensions are often reduced to attain a higher operating speed and a lower power consumption. However, with the ever-increasing level of integration of devices, the miniaturization of devices has almost reached its limit.

In recent years, a multi-gate structure such as a FinFET device is proposed to overcome the limitations imposed by the device miniaturization. Besides, strain engineering such as controlling the stress in the channel region of a transistor is also adopted. Source/drain regions are usually formed by growing epitaxial layers with an ion implantation process. However, different pattern densities in different regions across a wafer may affect the shapes and/or sizes of the grown epitaxial layers. When adjacent epitaxial layers are undesirably connected, a short circuit may occur, and the performance of the device may be decreased.

SUMMARY OF THE INVENTION

Accordingly, the present invention provides a FinFET device and a method of forming the same, in which epitaxial layers in different pattern density regions are formed separately with similar shapes and/or sizes, so the performance of the device is accordingly improved.

The present invention provides a method of forming a FinFET device that includes the following steps. A substrate is provided with a first region and a second region. First fins and second fins are formed on the substrate respectively in the first region and the second region. In an embodiment, a number of the first fins is different from a number of the second fins. A first dummy gate and a second dummy gate are formed respectively across the first fins and the second fins. A first spacer and a second spacer are sequentially formed on a sidewall of each of the first fins and the second fins. The first fins and the second fins are partially removed, so as to form first recesses in the first fins aside the first dummy gate and form second recesses in the second fins aside the second dummy gate. An oxidizing step is performed to the first spacers and the second spacers. Upper portions of the first spacers and the second spacers are removed. First epitaxial layers and second epitaxial layers are formed respectively in the first recesses and the second recesses. The first dummy gate and the second dummy gate are respectively replaced with a first gate and a second gate.

According to an embodiment of the present invention, the first spacers include SiOCN or SiCN, and the second spacers include SiN.

According to an embodiment of the present invention, the oxidizing step includes using $O_2$, $N_2O$, $O_3$ or a combination thereof.

According to an embodiment of the present invention, removing the upper portions of the first spacers and the second spacers includes using a hydrogen-containing gas and a fluorine-containing gas.

According to an embodiment of the present invention, the hydrogen-containing gas includes $NH_3$, $N_2H_4$, $HN_3$ or a combination thereof, and the fluorine-containing gas includes $NF_3$, $SiF_4$, $CF_4$, $CH_3F$, $CH_2F_2$, $CHF_3$, $C_2F_6$, $C_3F_8$ or a combination thereof.

According to an embodiment of the present invention, the number of the first fins is greater than the number of the second fins.

According to an embodiment of the present invention, the first region is a logic device region, and the second region is a SRAM device region.

According to an embodiment of the present invention, a maximum width of the first epitaxial layers is L1, a maximum width of the second epitaxial layers is L2, and (L2−L1)/L1 is equal to or less than about 1%.

According to an embodiment of the present invention, the first epitaxial layers and the second epitaxial layers include SiP or SiC.

According to an embodiment of the present invention, the method further includes, after removing the upper portions of the first spacers and the second spacers and before forming the first epitaxial layers and the second epitaxial layers, forming first buffer layers and second buffer layers respectively on surfaces of the first recesses and the second recesses.

According to an embodiment of the present invention, the first buffer layers and the second buffer layers include SiP or SiC, and a concentration of phosphorus or carbon of the first and second buffer layers is lower than a concentration of phosphorus or carbon of the first and second epitaxial layers.

The present invention further provides a FinFET device including a substrate, first fins and second fins, a first gate and a second gate, first epitaxial layers and second epitaxial layers. The substrate has a first region and a second region. The first fins and the second fins are disposed on the substrate respectively in the first region and the second region. In an embodiment, a number of the first fins is different from a number of the second fins. The first gate and the second gate are disposed on the substrate and respectively across the first fins and the second fins. The first epitaxial layers are disposed in first recesses of the first fins adjacent to the first gate. The second epitaxial layers are disposed in second recesses of the second fins adjacent to the second gate. In an embodiment, a maximum width of the first epitaxial layers is L1, a maximum width of the second epitaxial layers is L2, and (L2−L1)/L1 is equal to or less than about 1%.

According to an embodiment of the present invention, the number of the first fins is greater than the number of the second fins.

According to an embodiment of the present invention, the first region is a logic device region, and the second region is a SRAM device region.

According to an embodiment of the present invention, the first epitaxial layers and the second epitaxial layers include SiP or SiC.

According to an embodiment of the present invention, the FinFET device further includes first buffer layers on surfaces of the first recesses below the first epitaxial layers, and second buffer layers on surfaces of the second recesses below the second epitaxial layers.

According to an embodiment of the present invention, the first buffer layers and the second buffer layers include SiP or SiC, and a concentration of phosphorus or carbon of the first and second buffer layers is lower than a concentration of phosphorus or carbon of the first and second epitaxial layers.

According to an embodiment of the present invention, the FinFET device further includes a first spacer and a second spacer sequentially disposed on a sidewall of each of the first fins and second fins, and the first and second epitaxial layers laterally extend over the corresponding first and second spacers.

According to an embodiment of the present invention, tops of the first and second spacers in the first and second regions are substantially coplanar.

According to an embodiment of the present invention, the first spacers include SiOCN or SiCN, and the second spacers include SiN.

In view of the above, in the present invention, two steps of an oxide treatment and an oxide removal are performed prior to the foil cation of epitaxial layers in different regions. Such two steps remove the rough top portions of the spacers adjacent to the recesses, so the epitaxial layers grown from the recesses are formed with desired shapes and sizes, without being affected by the rough top portions of the spacers. Therefore, the performance of the device is accordingly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
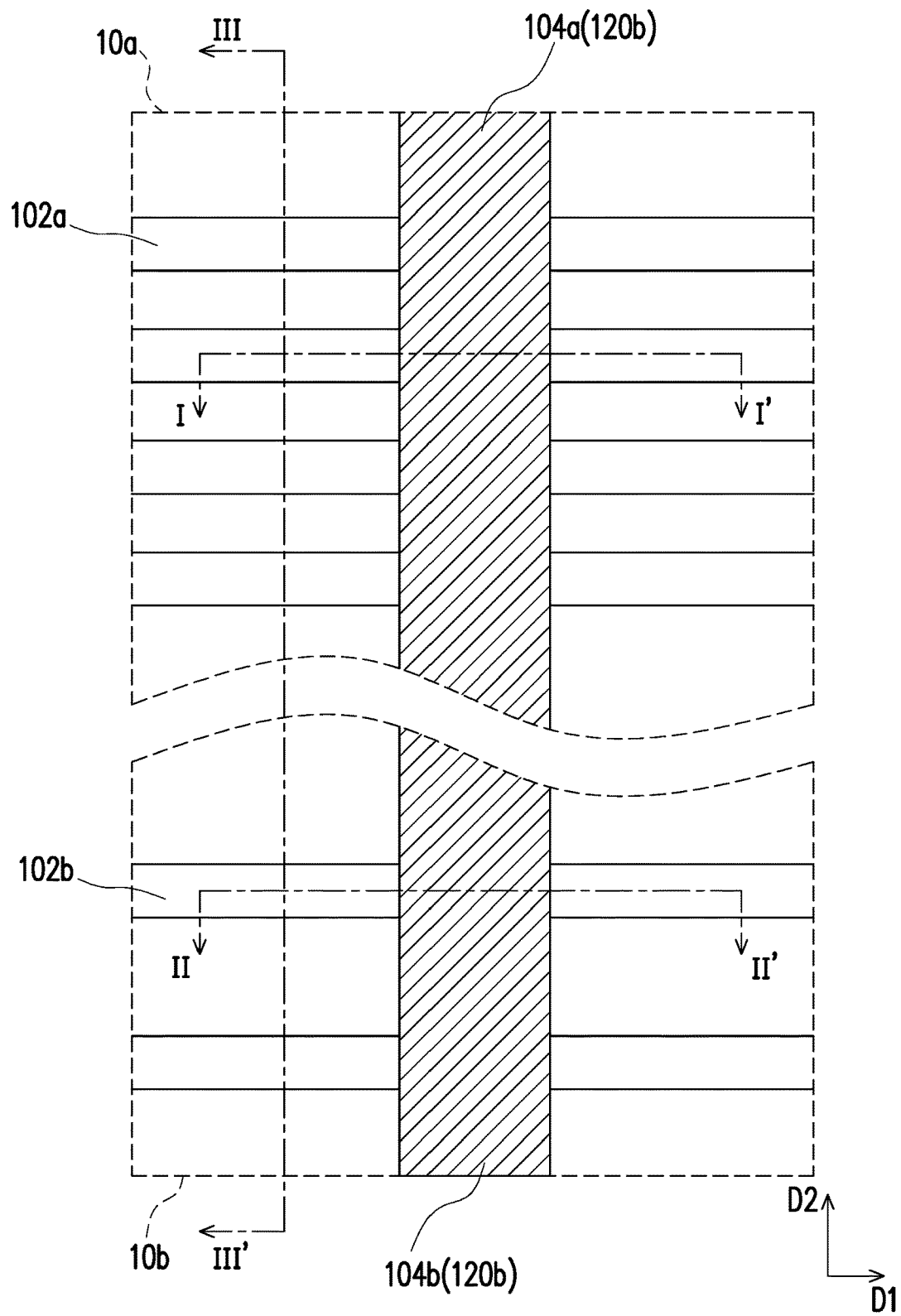
FIG. 1 is a simplified top view of a FinFET device according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a simplified top view of a FinFET device according to an embodiment of this invention, in which few elements such as fins and gates are shown for simplicity and clarity of illustration. FIG. 2A to FIG. 2G are schematic cross-sectional views of a method of forming a FinFET device in accordance with an embodiment of this invention, some of which are taken along the lines I-I', I-II' and III-III' of FIG. 1.

Figure 2A:
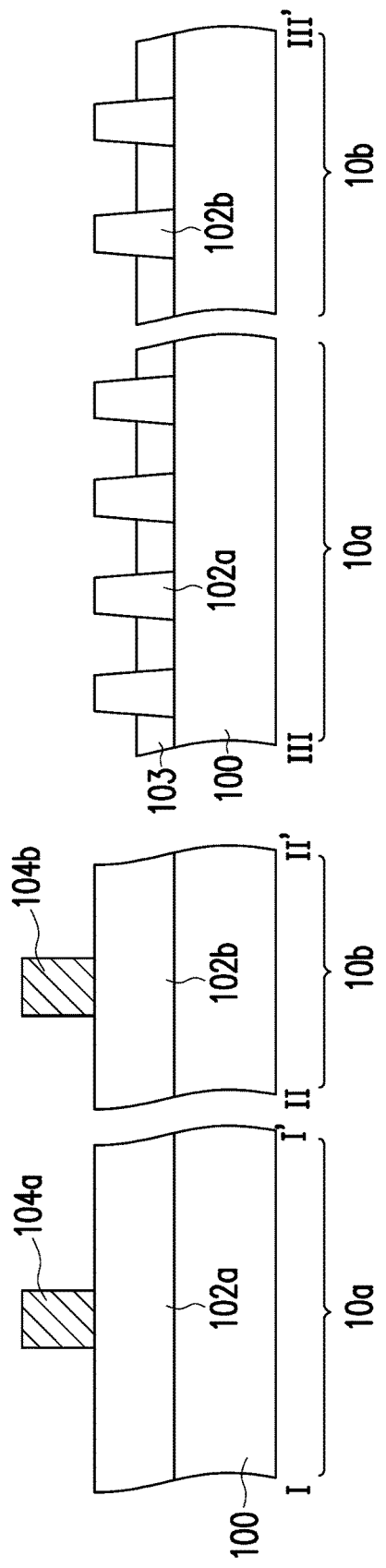
FIG. 2A to FIG. 2G are schematic cross-sectional views of a method of forming a FinFET device in accordance with an embodiment of this invention.

Referring to FIG. 1 and FIG. 2A, a substrate 100 is provided. The substrate 100 can be a semiconductor substrate, such as a silicon-containing substrate. The substrate 100 has a first region 10a and a second region 10b. In an embodiment, the first region 10a and the second region 10b have different pattern densities. For example, a pitch, a dimension or a number of a feature in the first region 10a is different from a pitch, a dimension or a number of a similar feature in the second region 10b. In an embodiment, the first region 10a and the second region 10b are regions for P-type devices with different functions. In an embodiment, the first region 10a is a logic device region, and the second region 10b is a SRAM device region.

Thereafter, the substrate 100 is patterned to form first fins 102a and second fins 102b respectively in the first region 10a and the second region 10b. The method of forming the first fins 102a and the second fins 102b may include performing photolithography and etching processes. In an embodiment, the first fins 102a and the second fins 102b extend in a first direction D1, as shown in FIG. 1. In an embodiment, the number of the first fins 102a is different from the number of the second fins 102b. For example, the number of the first fins 102a is greater than the number of the second fins 102b. In an embodiment, the pitch of the first fins 102a are different form the pitch of the second fins 102b. For example, the pitch of the first fins 102a are less than the pitch of the second fins 102b. Specifically, the first region 10a may be regarded as a dense region with more fins, and the second region 10b may be regarded as a sparse region with less fins.

Afterwards, an isolation layer 103 is formed on the substrate 100. In an embodiment, the isolation layer 103 covers the lower portions of the first and second fins 102a and 102b while exposes the upper portions of the first and second fins 102a and 102b. The isolation layer 103 may include silicon oxide, and may be formed by depositing an isolation material layer over the substrate 100 and followed by an etching back process.

Still referring to FIG. 1 and FIG. 2A, a first dummy gate 104a and a second dummy gate 104b are formed over the substrate 100 and respectively across the first fins 102a and the second fins 102b. The first dummy gate 104a and the second dummy gate 104b may include a silicon-containing material (e.g., polysilicon) and the forming method thereof includes performing deposition processes and the subsequent photolithography and etching processes. In an embodiment, the first dummy gate 104a and the second dummy gate 104b extend in a second direction D2 different from (e.g., perpendicular to) the first direction D1, as shown in FIG. 1. In an embodiment, an oxidation process is performed to the first and second fins 102a and 102b before the formation of the first dummy gate 104a and the second dummy gate 104b, and thus, an interfacial layer (not shown) is formed on the surface of each of the first and second fins 102a and 102b. In an embodiment, a cap layer (not shown) is formed on each of the first dummy gate 104a and the second dummy gate 104b upon the process requirements.

Figure 2B:
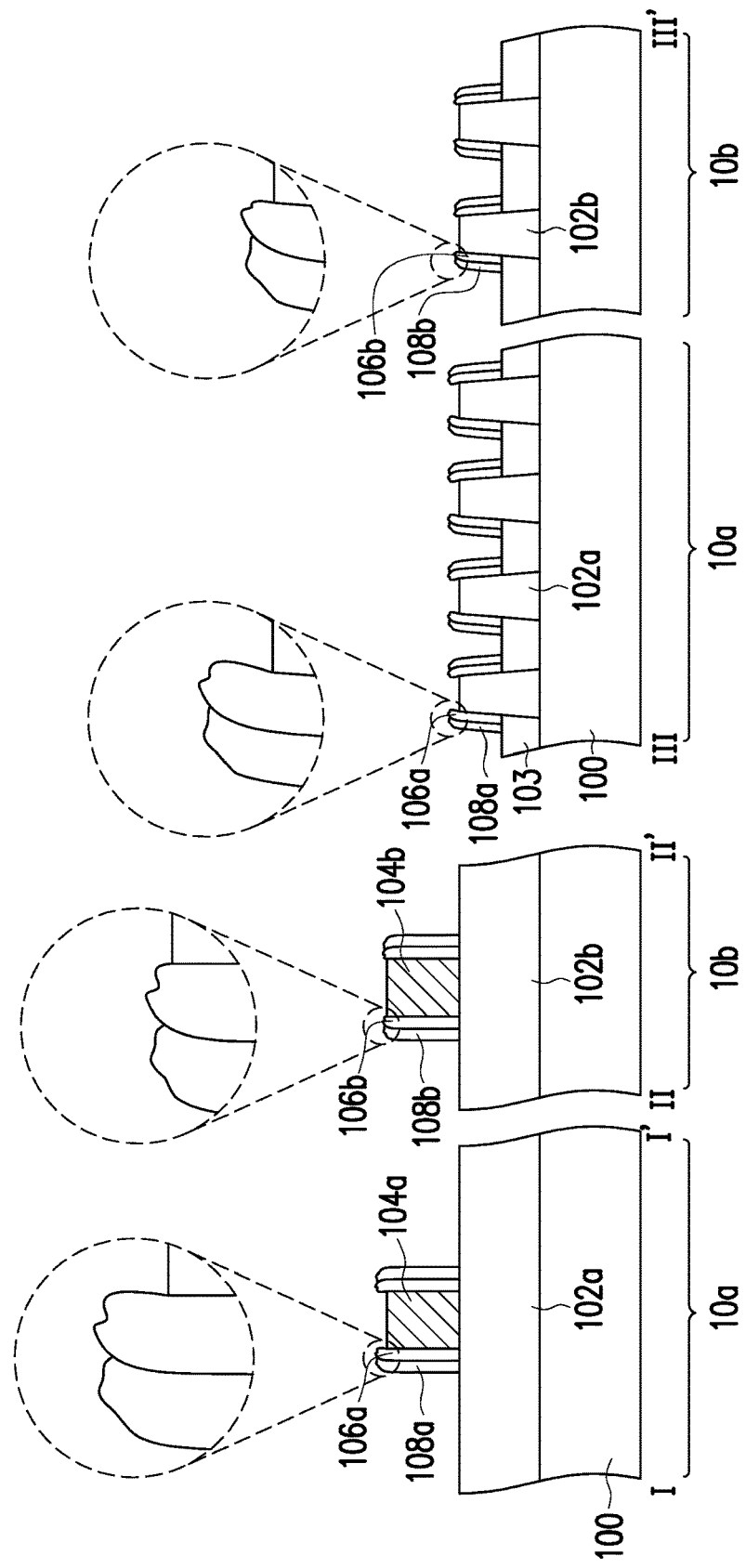

Referring to FIG. 2B, in the first region 10a, a first spacer 106a and a second spacer 108a are sequentially formed on the sidewall of first dummy gate 104a and on the sidewalls of the first fins 102a aside the first dummy gate 104a. Similarly, in the second region 10b, a first spacer 106b and a second spacer 108b are sequentially formed on the sidewall of second dummy gate 104b and on the sidewalls of the second fins 102b aside the second dummy gate 104b. In an embodiment, the first spacers 106a and 106b include a material different form that of the second spacers 108a and 108b. For example, the first spacers 106a and 106b include SiOCN or SiCN, and the second spacers 108a and 108b include SiN. The method of forming the first spacers 106a and 106b and the second spacers 108a and 108b includes depositing first and second spacer material layers (not shown) on the substrate 100 and performing at least one anisotropic etching process to the first and second spacer material layers. In an embodiment, due to the pattern loading effect of the anisotropic etching process, the first spacers 106a and 106b and the second spacers 108a and 108b are formed with rough and irregular top surfaces, as shown in the enlarged local views of FIG. 2B. In an embodiment, the tops of the first and second spacers 106a and 108a in the first region 10a (e.g., pattern dense region) is higher than the tops of the first and second spacers 106b and 108b in the second region 10b (e.g., pattern sparse region).

Figure 2C:
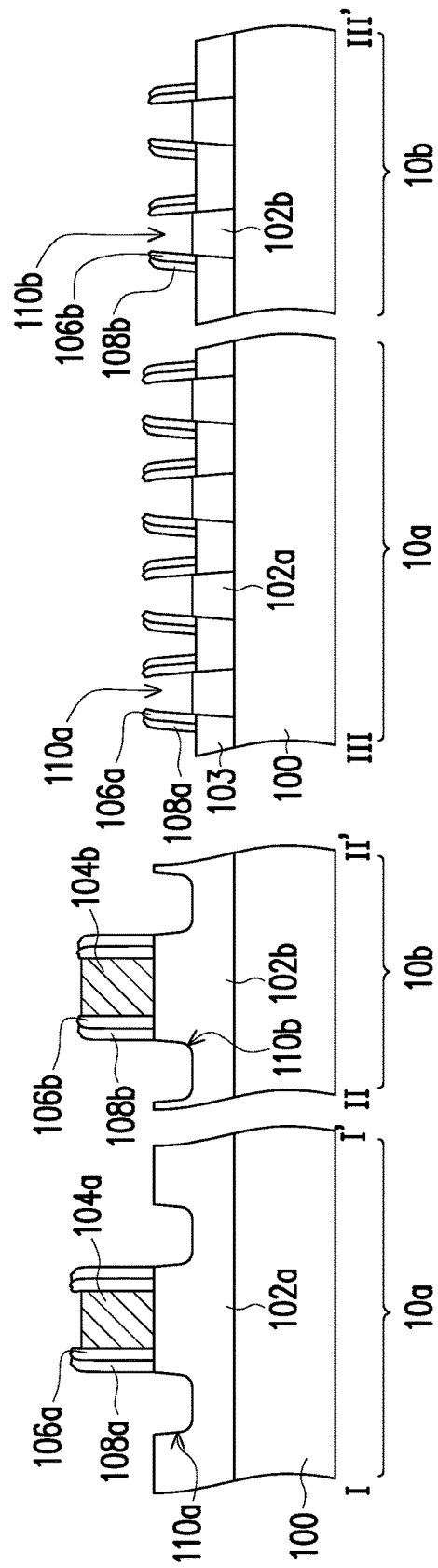

Referring to FIG. 2C, in the first region 10a, the first fins 102a are partially removed to form first recesses 110a in the first fins 102a aside the first dummy gate 104a. Specifically, the surface of one remaining first fin 102a and the adjacent first spacer 102a define a first recess 110a. Similarly, in the second region 10b, the second fins 102b are partially removed to form second recesses 110b in the second fins 102b aside the second dummy gate 104b. Specifically, the surface of one remaining second fin 102b and the adjacent first spacer 102b define a second recess 110b.

In an embodiment, the first fins 102a and the second fins 102b are vertically etched to a predetermined depth and may be laterally etched to form a desired profile. Each of the vertical etching step and the lateral etching step includes a dry etching, a wet etching or both. In an embodiment, the first and second recesses 110a and 110b are formed with a bucket-like shape, a diamond-like shape, a middle-wide shape or the like.

In an embodiment, the surfaces of the remaining first and second fins 102a and 102b are higher than the surface of the isolation layer 103, but the present invention is not limited thereto. In another embodiment, the surfaces of the remaining first and second fins 102a and 102b may be as high as or lower than the surface of the isolation layer 103 upon the process requirements.

Figure 2D:
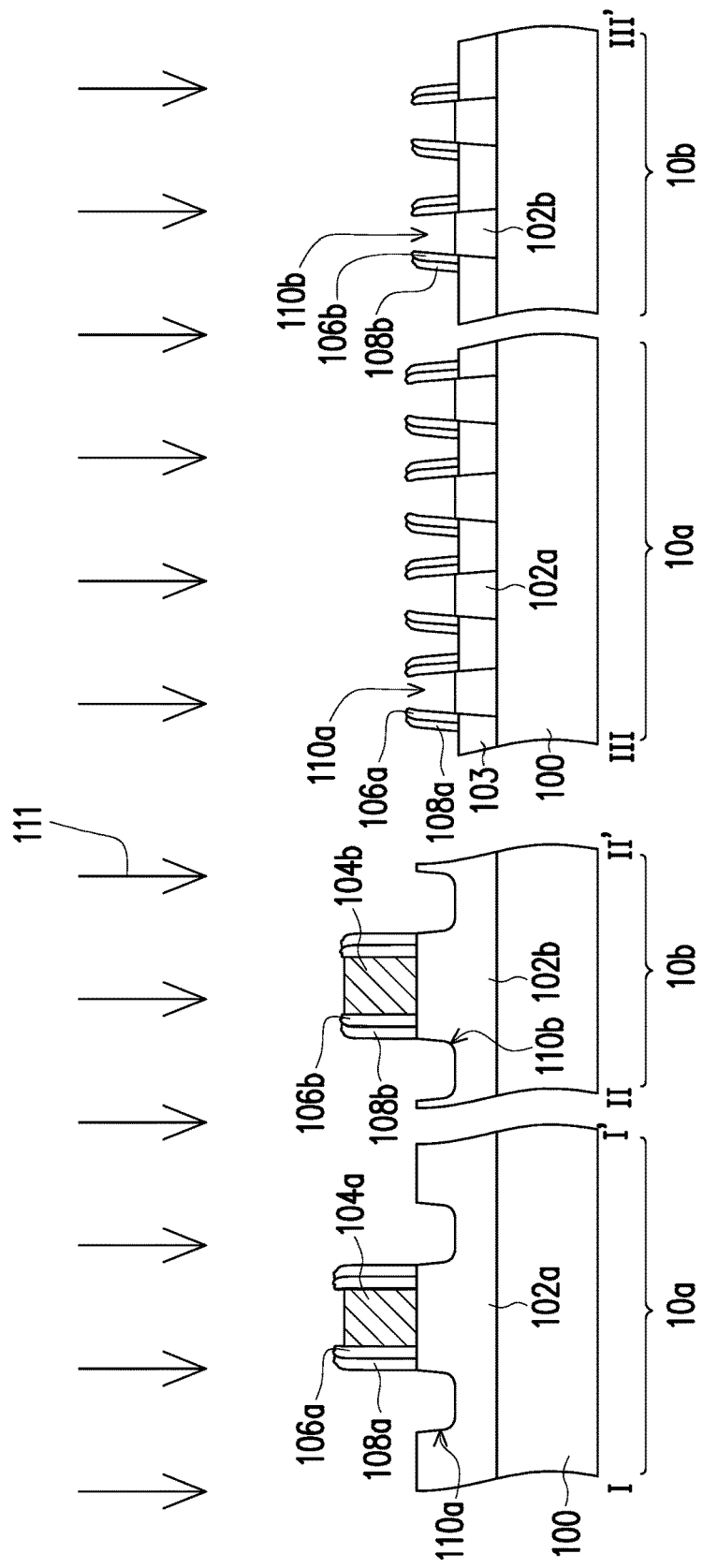

Referring to FIG. 2D, an oxidizing step 111 is preformed to the first spacers 106a and 106b and the second spacers 108a and 108b. In an embodiment, the oxidizing step 111 includes using $O_2$, $N_2O$, $O_3$ or a combination thereof. The oxidizing step 111 is configured to partially oxidize the spacers. In an embodiment, when the first spacers 106a and 106b include SiOCN, and the second spacers 108a and 108b include SiN, merely the second spacers 108a and 108b are partially oxidized. In another embodiment, when the first spacers 106a and 106b include SiCN, and the second spacers 108a and 108b include SiN, both the first spacers 106a and 106b and the second spacers 108a and 108b are partially oxidized. In the oxidizing step 111, the oxidation time and/or the oxidation temperature can be controlled to determine the oxidized amounts of the spacers.

Figure 2E:
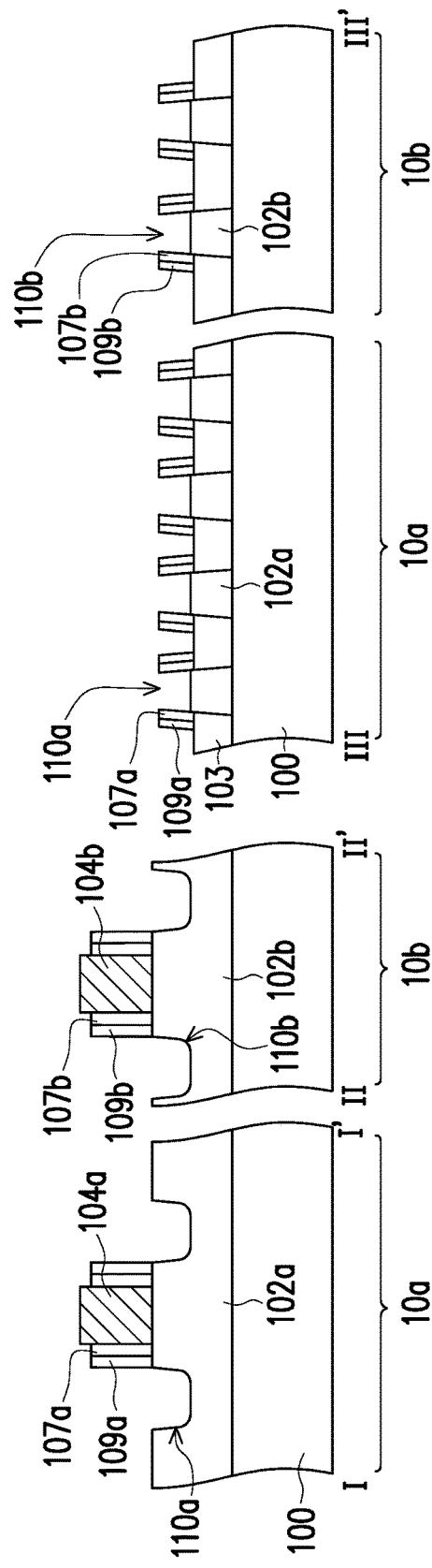

Referring to FIG. 2E, upper portions of the first spacers 106a and 106b and the second spacers 108a and 108b are removed. In an embodiment, the upper portions of the spacers indicate the oxidized portions of the spacers. In another embodiment, the upper portions of the spacers indicate the mixture of oxidized and non-oxidized portions of the spacers. In an embodiment, the removing step includes using a hydrogen-containing gas and a fluorine-containing gas. In an embodiment, the hydrogen-containing gas includes $NH_3$, $N_2H_4$, $HN_3$ or a combination thereof, and the fluorine-containing gas includes $NF_3$, $SiF_4$, $CF_4$, $CH_3F$, $CH_2F_2$, $CHF_3$, $C_2F_6$, $C_3F_8$ or a combination thereof. In an embodiment, the removing step includes performing a dry etching process, such as a chemical oxide removal (COR), a SiCoNi™ etching or a combination thereof.

Upon the removing step, the rough and irregular upper portions of the first spacers 106a and 106b and the second spacers 108a and 108b are completely removed. In an embodiment, the remaining first spacers 107a and 107b and the remaining second spacers 109a and 109b are provided with substantially planar top surfaces. In an embodiment, the tops of the first and second spacers 107a and 109a in the first region 10a (e.g., pattern dense region) is substantially coplanar with the tops of the first and second spacers 107b and 109b in the second region 10b (e.g., pattern sparse region).

Figure 2F:
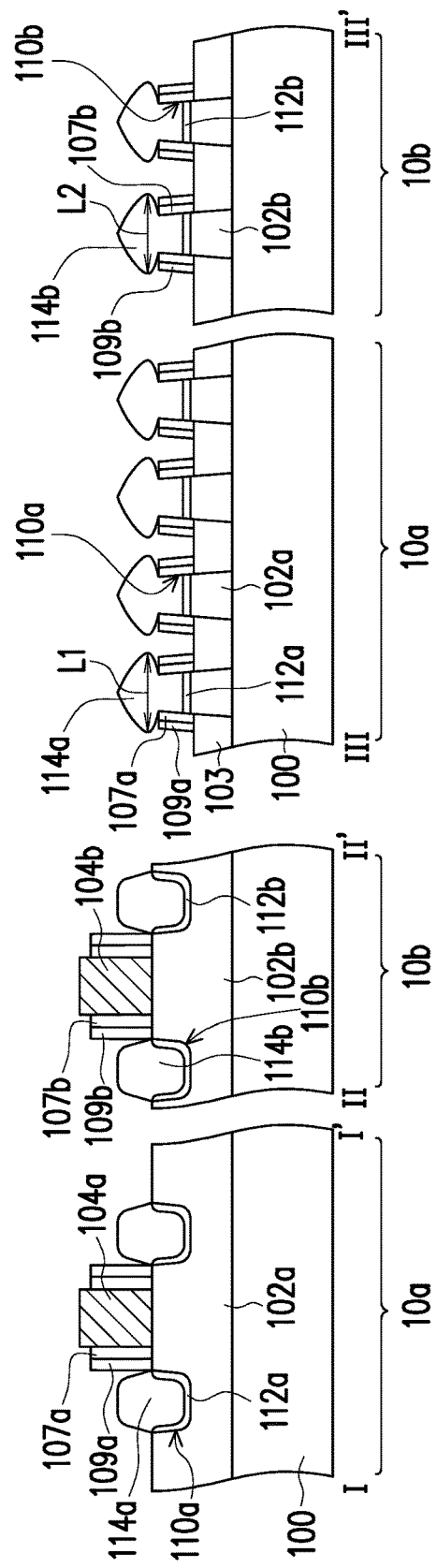

Referring to FIG. 2F, first epitaxial layers 114a and second epitaxial layers 114b are respectively formed in the first recesses 110a and the second recesses 110b. In an embodiment, the first epitaxial layers 114a and the second epitaxial layers 114b are formed by an epitaxial growth process with an ion implantation process. In an embodiment, in the first region 10a, the lower portions of the first epitaxial layers 114a are formed in the first recesses 110a, and the upper portions of the first epitaxial layers 114a are formed outside of the first recesses 110a and laterally extend over the first and second spacers 107a and 109a. Similarly, in the second region 10b, the lower portions of the second epitaxial layers 114b are formed in the second recesses 110b, and the upper portions of the second epitaxial layers 114b are formed outside of the second recesses 110b and laterally extend over the first and second spacers 107b and 109b. In an embodiment, the first and second recesses 110a and 110b are formed with a mushroom-like shape, a spade-like shape or the like.

In an embodiment, the first epitaxial layers 114a and the second epitaxial layers 114b include SiP or SiC, so as to provide tensile stresses to the channel regions. In an embodiment, the concentration of phosphorus or carbon of each of the first epitaxial layers 114a and the second epitaxial layers 114b is substantially constant. In another embodiment, the concentration of phosphorus or carbon of each of the first epitaxial layers 114a and the second epitaxial layers 114b is gradually varying from inside to outside and/or from bottom to top.

In an embodiment, in the first region 10a, each of the first epitaxial layers 114a are formed separately. Similarly, in the second region 10b, each of the second epitaxial layers 114b are formed separately.

It is noted that, due to the pattern loading effect of the epitaxial growth process, the sizes of epitaxial layers in different pattern density regions are usually significantly different from each other, and thus, the size difference between the epitaxial layers in different pattern density regions is large (e.g., about 20% or more). However, such issue is not observed in the present invention. Specifically, the epitaxial layers are grown after the rough top portions of the adjacent spacers are removed, so the grown rates of the epitaxial layers are not affected by the rough top portions of the adjacent spacers, and thus, the size difference between the epitaxial layers in different pattern density regions is small (e.g., about 1% or less).

In an embodiment, the first epitaxial layers 114a and the second epitaxial layers 114b are formed with similar sizes. In an embodiment, the size of the second epitaxial layers 114b is slightly greater than the size of the first epitaxial layers 114a. The size may be width, height or both. For example, the maximum width of the second epitaxial layers 114b is slightly greater than the maximum width of the first epitaxial layers 114a by about 1% or less. In an embodiment, each of the first epitaxial layers 114a and the second epitaxial layers 114b has a maximum with of about 410 angstroms to 480 angstroms, and the size difference between the first epitaxial layers 114a and the second epitaxial layers 114b is about 4 angstroms or less.

Figure 2G:
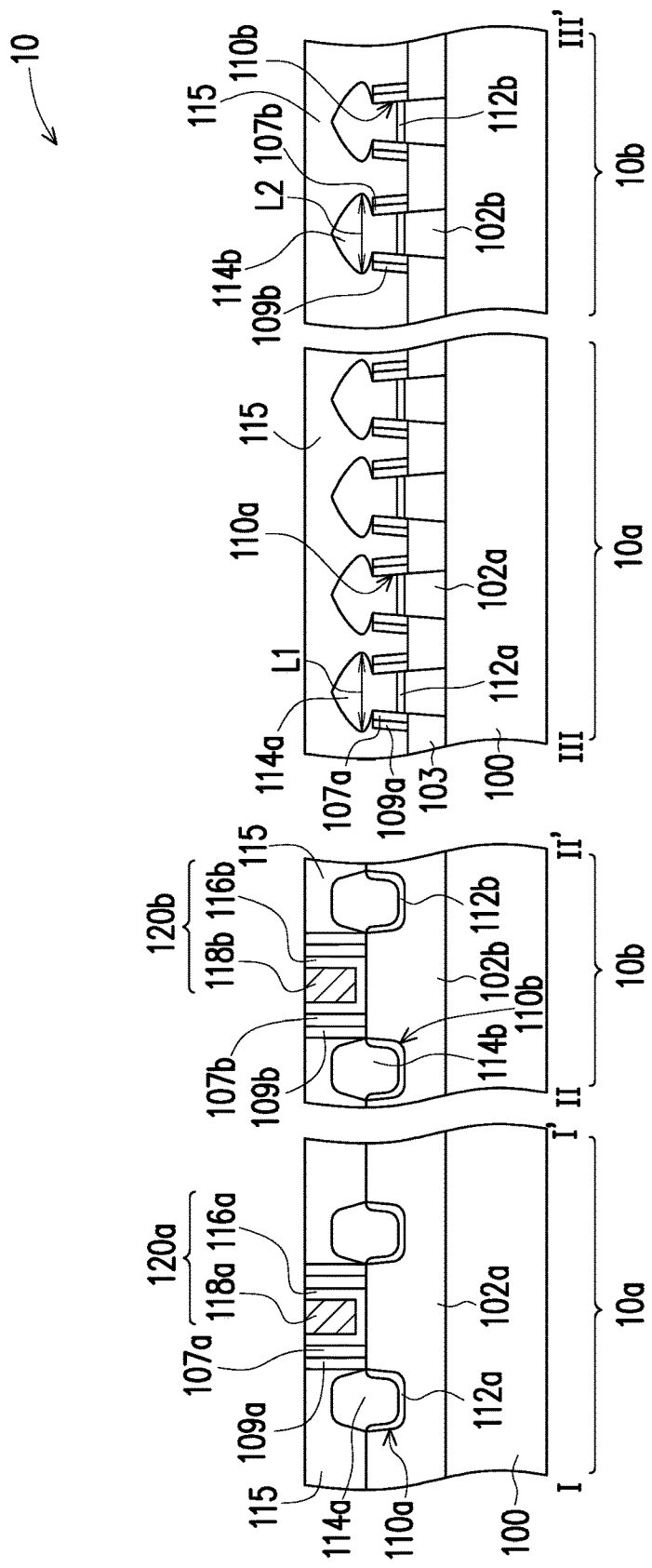

In an embodiment, after removing the upper portions of the first and second spacers (as shown in FIG. 2F) and before forming the first and second epitaxial layers (as shown in FIG. 2G), first buffer layers 112a and second buffer layers 112b are respectively formed on the surfaces of the first recesses 110a and the second recesses 110b. In an embodiment, the first buffer layers 112a and the second buffer layers 112b include SiP or SiC, and the concentration of phosphorus or carbon of the first and second buffer layers 112a and 112b is lower than the concentration of phosphorus or carbon of the first and second epitaxial layers 114a and 114b.

Referring to FIG. 2G, the first dummy gate 104a and the second dummy gate 104b are respectively replaced with a first gate 120a and a second gate 120b. In an embodiment, the first gate 120a and the second gate 120b extend in a second direction D2 different from (e.g., perpendicular to) the first direction D1, as shown in FIG. 1. In an embodiment, a dielectric layer 115 is formed over the substrate 100, surrounds the sidewalls of the first and second dummy gates 104a and 104b and exposes the tops of the first and second dummy gates 104a and 104b. The dielectric layer 115 may include silicon oxide, a low-k material, a suitable insulating material or a combination thereof. Thereafter, the first and second dummy gates 104a and 104b are removed to form first and second gate trenches in the dielectric layer 115.

Afterwards, first and second gates 120a and 120b are respectively formed in the first and second gate trenches. In an embodiment, in the first region 10a, the first gate 120a includes a first gate dielectric layer 116a and a first work function metal layer 118a. Similarly, in the second region 10b, the second gate 120b includes a second gate dielectric layer 116b and a second work function metal layer 118b. Each of the first and second gate dielectric layers 116a and 116b includes an interfacial layer, a high-k layer or a combination thereof. The interfacial layer includes silicon oxide, silicon oxynitride or the like. The high-k layer can be metal oxide including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT, x>0), barium strontium titanate ($Ba_xSr_{1-x}TiO_3$, BST, x>0) or a combination thereof. In an embodiment, for a P-type device, each of the first and second work function layers 118a and 118b includes titanium nitride (TiN), titanium carbide (TiC), tantalum nitride (TaN), tantalum carbide (TaC), tungsten carbide (WC) or aluminum titanium nitride (TiAlN) or a combination thereof. The FinFET device 10 of the invention is thus completed.

The structure of the FinFET device of the invention is descried below with reference to FIG. 2G. As shown in FIG. 2G, the FinFET device 10 includes a substrate 100, first fins 102a and second fins 102b, a first gate 120a and a second gate 120b, first epitaxial layers 114a and second epitaxial layers 114b. The substrate 100 has a first region 10a and a second region 10b. In an embodiment, the first region 10a is a logic device region, and the second region 10b is a SRAM device region. The first fins 102a and the second fins 102b are disposed on the substrate 100 respectively in the first region 10a and the second region 10b. In an embodiment, the number of the first fins 102a is different from (e.g., greater than) the number of the second fins 102b. The first gate 120a and the second gate 120b are disposed on the substrate 100 and respectively across the first fins 102a and the second fins 102b. The first epitaxial layers 114a are disposed in first recesses 110a of the first fins 102a adjacent to the first gate 120a. The second epitaxial layers 114b are disposed in second recesses 110b of the second fins 102b adjacent to the second gate 120b. In an embodiment, the first epitaxial layers 114a and the second epitaxial layers 114b include SiP or SiC. In an embodiment, the maximum width of the first epitaxial layers 114a is L1, the maximum width of the second epitaxial layers 114b is L2, and (L2−L1)/L1 is equal to or less than about 1%. For example, the ratio of (L2−L1)/L1 can be, for example but not limited to, about 0.001, 0.002, 0.003, 0.004, 0.005, 0.006, 0.007, 0.008, 0.009, 0.010, including any range between any two of the preceding values.

In an embodiment, each of the first and second epitaxial layers 114a and 114b has a mushroom-like shape. Specifically, each of the first and second epitaxial layers 114a and 114b has a lower portion (or mushroom stem portion) and an upper portion (or mushroom cap portion) over the lower portion. In an embodiment, the upper portions of the first and second epitaxial layers 114a and 114b has a diamond-like shape or a middle-wide profile.

In an embodiment, the FinFET device 10 further includes first spacers 107a and 107b and second spacers 109a and 109b surround the lower portions (or mushroom stem portions) and below the upper portions (or mushroom cap portions) of the first and second epitaxial layers 114a and 114b. Specifically, in the first region 10a, a first spacer 107a and a second spacer 109a are sequentially disposed on the sidewall of each of the first fins 102a, and the first epitaxial layers 114a laterally extend over the corresponding first and second spacers 107a and 109a. Similarly, in the second region 10b, a first spacer 107ab and a second spacer 109b are sequentially disposed on the sidewall of each of the second fins 102b, and the second epitaxial layers 114b laterally extend over the corresponding first and second spacers 107b and 109b. In an embodiment, the tops of the first spacers 107a and 107b and the second spacers 109a and 109b in the first and second regions 10a and 10b are substantially coplanar. In an embodiment, the first spacers 107a and 107b include SiOCN or SiCN, and the second spacers 109a and 109b include SiN.

In an embodiment, the FinFET device 10 further includes first buffer layers 112a and second buffer layers 112b. The first buffer layers 112a are disposed on surfaces of the first recesses 110a below the first epitaxial layers 114a. The second buffer layers 112b are disposed on surfaces of the second recesses 110b below the second epitaxial layers 114b. In an embodiment, the first buffer layers 112a and the second buffer layers 112b include SiP or SiC, and the concentration of phosphorus or carbon of the first and second buffer layers 112a and 112b is lower than the concentration of phosphorus or carbon of the first and second epitaxial layers 114a and 114b.

In view of the above, in the present invention, before epitaxial layers are grown from recesses in different pattern density regions, the rough top portions of the spacers adjacent to the recesses are removed with two steps of an oxidizing treatment and an oxide removal. Since the rough top portions of the spacers are removed without affecting the grown rates of the epitaxial layers, the epitaxial layers in different pattern density regions are formed with desired shapes and sizes. Therefore, the performance of the device is accordingly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A FinFET device, comprising:
a substrate having a first region and a second region;
first fins and second fins disposed on the substrate respectively in the first region and the second region, wherein a number of the first fins is different from a number of the second fins;
a first gate and a second gate disposed on the substrate and respectively across the first fins and the second fins;
first epitaxial layers disposed in first recesses of the first fins adjacent to the first gate; and
second epitaxial layers disposed in second recesses of the second fins adjacent to the second gate,
wherein a maximum width of the first epitaxial layers is L1, a maximum width of the second epitaxial layers is L2, L2 is greater than L1, and (L2−L1)/L1 is equal to or less than about 1%.

2. The FinFET device of claim 1, wherein the number of the first fins is greater than the number of the second fins.

3. The FinFET device of claim 1, wherein the first region is a logic device region, and the second region is a SRAM device region.

4. The FinFET device of claim 1, wherein the first epitaxial layers and the second epitaxial layers comprise SiP or SiC.

5. The FinFET device of claim 4, further comprising:
first buffer layers on surfaces of the first recesses below the first epitaxial layers; and
second buffer layers on surfaces of the second recesses below the second epitaxial layers.

6. The FinFET device of claim 5, wherein the first buffer layers and the second buffer layers comprise SiP or SiC, and a concentration of phosphorus or carbon of the first and second buffer layers is lower than a concentration of phosphorus or carbon of the first and second epitaxial layers.

7. The FinFET device of claim 1, further comprising a first spacer and a second spacer sequentially disposed on a sidewall of each of the first fins and second fins, and the first and second epitaxial layers laterally extend over the corresponding first and second spacers.

8. The FinFET device of claim 7, wherein tops of the first and second spacers in the first and second regions are substantially coplanar.

9. The FinFET device of claim 7, wherein the first spacers comprise SiOCN or SiCN, and the second spacers comprise SiN.

* * * * *